(12) United States Patent
Runyan et al.

(10) Patent No.: US 9,917,041 B1
(45) Date of Patent: Mar. 13, 2018

(54) 3D CHIP ASSEMBLIES USING STACKED LEADFRAMES

(71) Applicant: Intel Corporation, Santa Clara, CA (US)

(72) Inventors: Cory A. Runyan, Folsom, CA (US); Florence R. Pon, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/338,162

(22) Filed: Oct. 28, 2016

(51) Int. Cl.
*H01L 25/16* (2006.01)
*H01L 23/495* (2006.01)
(Continued)

(52) U.S. Cl.
CPC .... *H01L 23/49575* (2013.01); *H01L 21/4825* (2013.01); *H01L 21/78* (2013.01); *H01L 23/3142* (2013.01); *H01L 23/49513* (2013.01); *H01L 23/49537* (2013.01); *H01L 23/49541* (2013.01); *H01L 24/32* (2013.01); *H01L 24/83* (2013.01); *H01L 24/97* (2013.01); *H01L 25/0657* (2013.01); *H01L 25/50* (2013.01); H01L 2224/2919 (2013.01); H01L 2224/29144 (2013.01); H01L 2224/32245 (2013.01); H01L 2224/83203 (2013.01); H01L 2225/06572 (2013.01); H01L 2924/01404 (2013.01); H01L 2924/1438 (2013.01);
(Continued)

(58) Field of Classification Search
CPC . H01L 2924/00012; H01L 2224/32145; H01L 25/0657; H01L 2224/16145; H01L 23/4951; H01L 2924/181; H01L 2224/45147; H01L 2224/49171; H01L 2224/48145; H01L 23/49575
See application file for complete search history.

(56) References Cited

U.S. PATENT DOCUMENTS 5,586,009 A * 12/1996 Burns ............... H01L 23/49555
257/685
5,811,877 A 9/1998 Miyano et al.
(Continued)

OTHER PUBLICATIONS

International Search Report and Written Opinion for International Patent Application No. PCT/US17/50548, dated Dec. 28, 2017.

*Primary Examiner* — Roy Potter
(74) *Attorney, Agent, or Firm* — Green, Howard, & Mughal LLP.

(57) ABSTRACT

A stacked-chip assembly including a plurality of IC chips or die that are stacked, and a plurality of stacked leads. Leads from separate leadframes may be bonded together so as to tie corresponding metal features of the various chips to a same ground, signal, or power rail. Each leadframe may include a center paddle, which is disposed between two chips in the stack. The center paddle may function as one or more of a thermal conduit and common electrical rail (e.g., ground). The leadframes may be employed without the use of any bond wires with leads bonded directly to bond pads of the chips. A first IC chip may be mounted to a base leadframe and subsequent die-attach leadframes and IC chips are stacked upon the first IC chip and base leadframe. The die-attach leadframes may be iteratively bonded to an underlying leadframe and the bonded stacked leads stamped out of their respective leadframe sheets.

20 Claims, 11 Drawing Sheets

(51) Int. Cl.
  *H01L 25/065* (2006.01)
  *H01L 23/00* (2006.01)
  *H01L 23/31* (2006.01)
  *H01L 25/00* (2006.01)
  *H01L 21/48* (2006.01)
  *H01L 21/78* (2006.01)
(52) U.S. Cl.
  CPC ................ *H01L 2924/1443* (2013.01); *H01L 2924/14511* (2013.01); *H01L 2924/1776* (2013.01); *H01L 2924/17747* (2013.01)

(56) References Cited

U.S. PATENT DOCUMENTS

| 6,028,352 | A  | * | 2/2000  | Eide ................ H01L 23/49537 |
|           |    |   |         | 257/398 |
| 2001/0028104 | A1 |  | 10/2001 | Fukatsu et al. |
| 2006/0231937 | A1 |  | 10/2006 | Juskey et al. |
| 2008/0122113 | A1 |  | 5/2008  | Corisis et al. |
| 2013/0020690 | A1 |  | 1/2013  | Qiu et al. |

* cited by examiner

3D CHIP ASSEMBLIES USING STACKED LEADFRAMES

BACKGROUND

There are many integrated circuit (IC) chip, or die, packaging technologies. A number of advanced IC packages include a plurality of IC chips in a stack, which reduce the footprint of the IC chips to improve device density within a given platform (e.g., mobile device, computer, automobile). FIG. 1A illustrates a plan view of a conventional stacked-chip assembly 101. FIG. 1B illustrates a cross-sectional view of stacked-chip assembly 101. As shown, IC chip 111 is stacked over IC chip 110, IC chip 112 is further stacked over IC chip 111, and IC chip 113 is further stacked over IC chip 112. Between each IC chip is a die attach material 140 (e.g., paste or film). To accommodate electrical connection (e.g., power, signal, ground) by wire bonds, stacked chips may be laterally offset or displaced in one or more dimensions relative to an underlying/overlying chip. For example, chip 111 is laterally offset in the x-dimension from an edge of chip 110. Similarly, chip 112 is laterally offset in the x-dimension from an edge of chip 111. Such an IC chip stack requires a footprint that is a function of both the chip size and the cumulative chip offset required for the wire bonds. For example, in FIG. 1B, the stack footprint is a function of both the chip length $L_c$ and offset length $L_o$. As such, staggering the chips increases package size.

As further shown in FIGS. 1A and 1B, wire bonds may be waterfalled from a top most chip (e.g., 113) to successively lower chips until landing on a package substrate 105. Such waterfalled wire bonds are typical in applications where the chips in the stack are the same and various pads on each chip may be powered, grounded, or signaled concurrently with corresponding pads on another chip. Such an architecture is common for a NAND flash memory chip, which often accommodate metal features on one or two sides of the chip (e.g., opposite edges laterally separated in the x-dimension in FIG. 1A, 1B). In addition to the offset increasing package footprint, package substrate 105 increases the z-thickness of assembly 101, and all increases the cost of the package assembly.

Heat generated by the stacked chips during operation of assembly 101 is another issue. For example, heat generated by chip 110 may need to conduct through chip 111, 112, and 113 to reach a heat sink disposed over the chip stack (e.g., landed on chip 113). The bulk material composition (e.g., silicon) often has a relatively low thermal conductivity, making it difficult to adequately cool chips within a stacked-chip assembly.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures.

DETAILED DESCRIPTION OF EXEMPLARY EMBODIMENTS

Figure 1A:
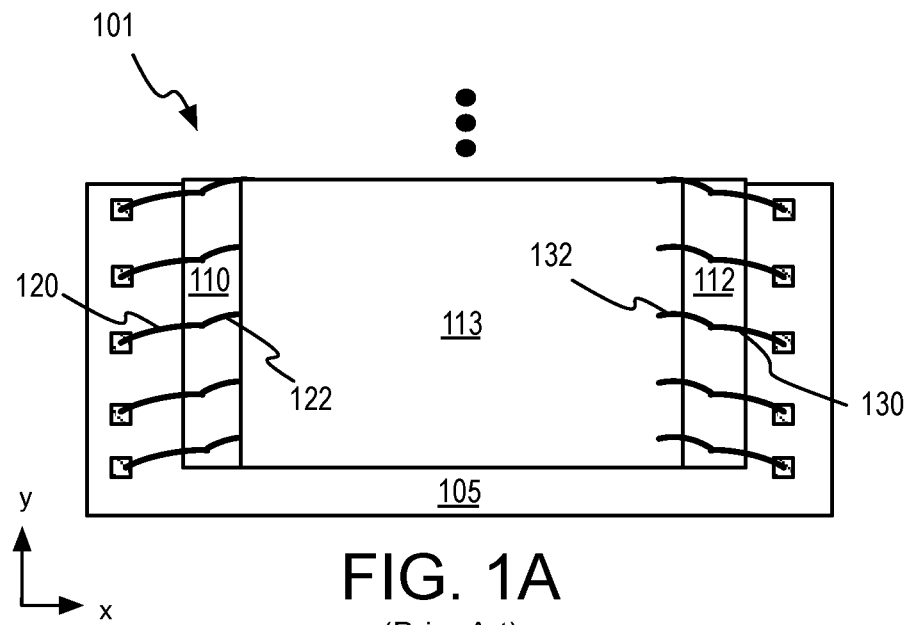
FIG. 1A illustrates a top-down plan view of a conventional stacked-chip assembly.

Embodiments are described with reference to the enclosed figures. While specific configurations and arrangements are depicted and discussed in detail, it should be understood that this is done for illustrative purposes only. Persons skilled in the relevant art will recognize that other configurations and arrangements are possible without departing from the spirit and scope of the description. It will be apparent to those skilled in the relevant art that techniques and/or arrangements described herein may be employed in a variety of other systems and applications other than what is described in detail herein.

Reference is made in the following detailed description to the accompanying drawings, which form a part hereof and illustrate exemplary embodiments. Further, it is to be understood that other embodiments may be utilized and structural and/or logical changes may be made without departing from the scope of claimed subject matter. It should also be noted that directions and references, for example, up, down, top, bottom, and so on, may be used merely to facilitate the description of features in the drawings and are not intended to restrict the application of claimed subject matter. Therefore, the following detailed description is not to be taken in a limiting sense and the scope of claimed subject matter is defined solely by the appended claims and their equivalents.

In the following description, numerous details are set forth, however, it will be apparent to one skilled in the art, that embodiments may be practiced without these specific details. In some instances, well-known methods and devices are shown in block diagram form, rather than in detail, to avoid obscuring inventive aspects of the exemplary embodiments. References throughout this specification to "an embodiment" or "one embodiment" mean that a particular feature, structure, function, or characteristic described in connection with the embodiment is included in at least one embodiment. Thus, the appearances of the phrase "in an embodiment" or "in one embodiment" in various places throughout this specification are not necessarily referring to the same embodiment. Furthermore, the particular features, structures, functions, or characteristics may be combined in any suitable manner in one or more embodiments. For example, a first embodiment may be combined with a second embodiment anywhere the particular features, structures, functions, or characteristics associated with the first and second embodiments are not mutually exclusive.

As used in the description of the exemplary embodiments and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. As used throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical, optical, or electrical contact with each other, and/or that the two or more elements co-operate or interact with each other (e.g., as in a cause an effect relationship).

The terms "over," "under," "between," and "on" as used herein refer to a relative position of one component or material layer with respect to other components or layers where such physical relationships are noteworthy. For example in the context of material layers, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similar distinctions are to be made in the context of component assemblies.

As described in greater detail below, a stacked-chip assembly includes a plurality of IC chips or die that are stacked, and a plurality of stacked leads. In some embodiments, leads from separate leadframes are bonded together at a periphery of the stack so as to tie corresponding metal features of the various chips to a same ground, signal, or power rail. In some embodiments, each leadframe includes a center paddle, which is disposed between two chips in the stack. The center paddle may function as a common rail (e.g., ground) and/or thermal conduit. In some embodiments, the leadframes are employed without the use of any bond wires, and leads of the leadframes may be bonded directly to the metal features (e.g., bond pads) of the chips. In some embodiments, a first IC chip is mounted to a base leadframe and subsequent die-attach leadframes and IC chips are stacked upon the first IC chip and base leadframe. The die-attach leadframes may be iteratively bonded to an underlying leadframe and the bonded stacked leads stamped out of their respective leadframe sheets. In some embodiments, individual IC chips may be iteratively mounted to individual leadframes. Individual leadframe-mounted IC chips may then be stacked, and the stack stamped to bond and/or cut the stacked leads from their respective leadframe sheets.

Figure 2A:
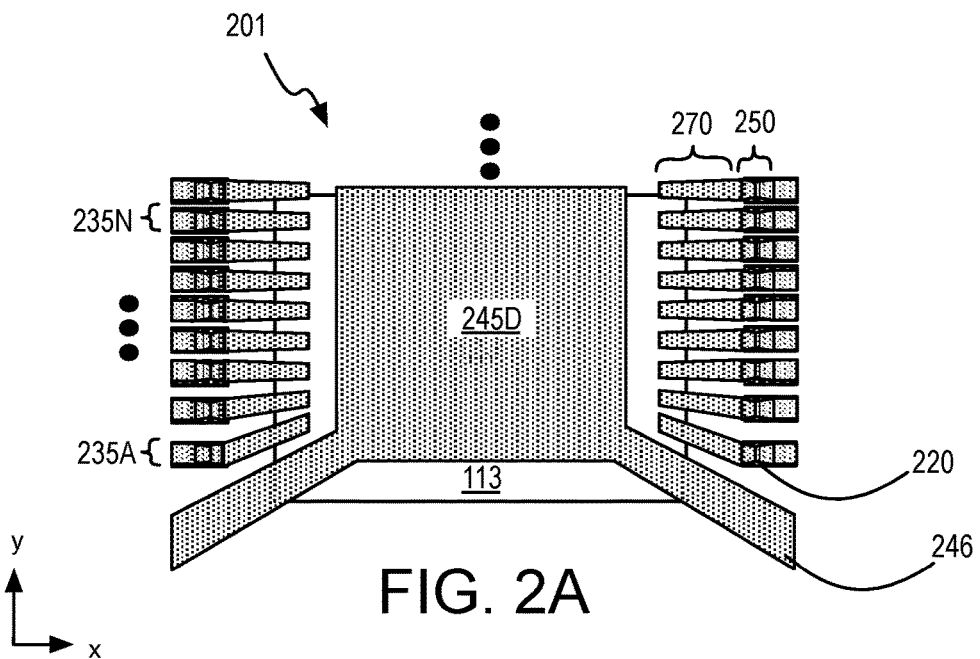
FIG. 2A illustrates a top-down plan view of a stacked-chip assembly including stacked leads, in accordance with an embodiment.

FIG. 2A illustrates a top-down plan view of a stacked IC chip assembly 201, in accordance with some embodiments. Assembly 201 includes a paddle 245D, that may be of any material having suitable electrical and/or or thermal conductivity, such as any elemental metal or metal alloy (i.e., metallic). Paddle 245D is disposed over a top-most IC chip 113. At least one electrically conductive lead of lead stacks 235A-235N is coupled to an electrically conductive feature of IC chip 113, such as a bond pad, pin, or post. Each lead stack 235A-235N includes a first portion 250 and a second portion 270. Within lead portion 250, leads of each lead stack 235A-235N are electrically connected (e.g., thermocompression bonded). Within lead portion 270, each lead of lead stack 235A-235N is electrically coupled to at least one IC chip of a chip stack. In the exemplary embodiments illustrated in FIG. 2A, lead portion 250 is at a periphery of the IC stack demarked by the edge of IC chip 113. Spatially co-located leads coupling to different IC chips in the stack are electrically tied together at a peripheral location beyond the IC chip edge. As shown, each lead stack 235A-235N is physically separated and electrically isolated from it's nearest neighbors, enabling each stack to maintain different ground/signal/power levels at each I/O of IC chip 113. Each lead stack 235A-235N may also be physically and electrically independent of paddle 245D, as shown.

Figure 2B:
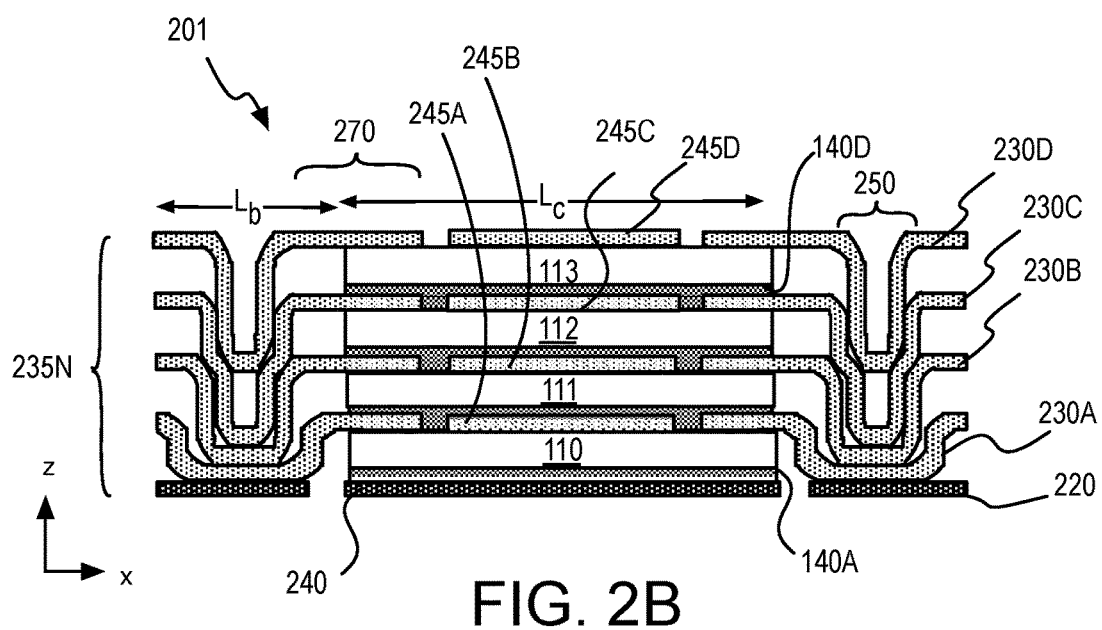
FIG. 2B illustrates a cross-sectional view of a stacked-chip assembly including stacked leads, in accordance with an embodiment.

FIG. 2B illustrates a cross-sectional view of a stacked-chip assembly 201, in accordance with an embodiment. The chip stack includes IC chips 110, 111, 112, 113, which may each be any IC chip. In some embodiments, all of IC chips 110-113 have substantially the same footprint (e.g., same chip length $L_c$) and substantially the same pin-out layout (e.g., bond pad locations). In some advantageous embodiments, IC chips 110-113 are flash memory chips, such as NAND chips. Depending on the IC chip, chip z-thickness may vary. Embodiments herein are not limited to ultra-thin chips, and IC chips with a thickness of 100 μm, or more are compatible. Likewise, embodiments herein are also compatible with ultra-thin chips having a thickness of 100 μm, or less. As further shown, lead stack 235N includes a base lead 220 and one or more die-attach leads 230. In the exemplary embodiment with four chips 110-113, there are four stacked die-attach leads 230A, 230B, 230C, and 230D. In the embodiments exemplified by FIG. 2B, lead portion 270 of each die-attach lead 230A-230D makes direct contact with a bond pad (not depicted) disposed on a face (e.g., front-side surface) of one IC chip 110-113. As such, along the z-axis, die-attach leads 230A-230D are interdigitated with IC chips 110-113. Each die-attach lead 230A-230D further includes lead portion 250, which contacts one or more other lead (e.g., another die-attach lead 230 and/or base lead 220). In some exemplary embodiments, die-attach lead 230A is directly (e.g., thermo-compression) bonded to base lead 220, die-attach lead 230A is thermo-compression bonded to die-attach lead 230B, die-attach lead 230C is thermo-compression bonded to die-attach lead 230B, and die-attach lead 230D is thermo-compression bonded to die-attach lead 230C. Although the cross-sectional view shown in FIG. 2B illustrates only two side of the chip stack, a similar arrangement may be present on the orthogonal sides. Alternatively, independent signal leads (e.g., chip enable, etc.) that are specific to each chip the stack are not stacked in the manner illustrated in FIG. 2B (i.e., not co-located and bonded together).

In some embodiments, a paddle is disposed between two stacked IC chips. The intervening paddle may have high thermal and/or electrical conductivity and may enhance removal of heat laterally from a stacked-chip assembly relative to stacks lacking such a paddle. In some embodiments, there is a metallic paddle disposed between every IC chip within a stack. Each paddle may be physically and electrically independent of one or more of the lead stacks. In some embodiments, every paddle is physically and electrically independent of all of the lead stacks. There may also be a base paddle upon which all the IC chips are stacked and a topmost die-attach paddle disposed over the entire chip stack. In FIG. 2B for example, IC chip 110 is disposed over a base paddle 240. Base paddle 240 may be of the same material composition and thickness as base lead 220; the two features having been stamped out of the same leadframe sheet, for example. Exemplary leadframe materials include Cu (in elemental or an alloyed form) and stainless steel (e.g., alloy 42). However, other metals (elemental or alloyed) may also be employed. Depending on the leadframe material, the leadframe may have surface finish, such as, but not limited to, an adhesion layer (e.g., Ni) and a bonding layer (e.g., Au). Exemplary leadframe thicknesses range from 90-200 µm, but thinner embodiments (e.g., 24 µm, or less) are also possible.

Intervening between IC chip 111 and 110 is a die-attach paddle 245A. Die-attach paddle 245A may be of the same material composition and thickness as die-attach lead 230A, the two features having been stamped out of the same sheet, for example. Similar die-attach paddles are disposed between chips 112 and 111, as well as between chips 113 and 112. In some embodiments, a base paddle 240 and base lead 220 are thicker and/or have a different composition than die-attach paddle 245A and die-attach lead 230A, for example to provide a more substantial assembly substrate. For example, base paddle 240 and base lead 220 may be at least 50 µm in thickness (e.g., z-axis), whereas die-attach paddle 245A and die-attach lead 230A may be less than 25 µm in thickness. Exemplary die-attach leadframe materials include Cu (in elemental or an alloyed form) and stainless steel (e.g., alloy 42). However, other metals (elemental or alloyed) may also be employed. Depending on the leadframe material, the leadframe may have surface finish, such as, but not limited to, an adhesion layer (e.g., Ni) and a bonding layer (e.g., Au). In some further embodiments, a base paddle (e.g., 240) has a larger footprint than a die-attach paddle (e.g., 245A). Such architectural features are indicative of the base leadframe functioning as a stacked lead assembly substrate. In addition to serving as the assembly substrate, base paddle 240 may also provide an electrical connection (e.g., ground or power) to the IC chip, if desired. In alternative embodiments, for example where an IC chip is flipped over relative a leadframe, the base paddle area may be substantially equal to that of a die-attach leadframe with every leadframe in the stack then making the same number of electrical connections to the chip, as described further below.

In some embodiments, a paddle disposed between two stacked IC chips makes thermal contact with a heat sink (not depicted). The heat sink may be disposed over, or adjacent to, IC chip stack assembly 201. The paddle (e.g., paddle ends 246 shown in FIG. 2A) may by thermally coupled to a heat sink on a substrate (not depicted). Alternatively, paddle ends 246 may be thermally coupled to a heat sink disposed on or above paddle 245D. In some embodiments where a paddle is disposed over every IC chip in the stack, a portion of the paddle at the periphery of the chip stack may be further connected (e.g., directly bonded together) to thermally tie each chip to a common heat sink.

In some embodiments, a paddle disposed between two stacked IC chips makes electrical contact to a metal feature on one or more IC chip. The metal feature, such as, but not limited to, a bond pad may make electrical contact with the paddle. The paddle (e.g., paddle ends 246 shown in FIG. 2A) may further contact a metal feature on a substrate (not depicted) that provides a reference potential, such as, but not limited to, a ground plane. In some embodiments where a paddle is disposed over every IC chip in the stack, a portion of the paddle at the periphery of the chip stack may be further connected (e.g., directly bonded together) to one or more other paddle to electrically tie a metal feature on each chip to the same common reference potential (e.g., a stacked-chip ground rail).

In some embodiments, a die-attach paste (DAP) or die-attach film (DAF) is disposed between one or more die of an assembly including an IC chip stack and stacked leads. The die-attach material may be employed to adhere IC chips together as a stacked die assembly is fabricated. In the example shown in FIG. 2B, a first DAP/DAF 140A (e.g., an epoxy) is disposed between IC chip 110 and base paddle 240. Base paddle 240 may serve primarily as a substrate to which IC chip 110 is aligned and affixed, for example by a pick-and-place operation, while die-attach paddle 245A may make more direct thermal and/or electrical contact to IC chip 110. A layer of DAP/DAF material may be disposed between a chip paddle and each overlying IC chip. For example, DAP/DAF material 140D is disposed between chip paddle 245C and IC chip 113. Assembly 201 is indicative of an assembly process in which chip 110 is first mounted to base paddle 240 and held in place with DAP/DAF material 140 while die-attach lead 230A is bonded to chip 110. Bonding to chip 110 may be concurrent with bonding to base lead 220. Chip 111 is then mounted to die-attach paddle 245A and held in place with DAP/DAF material 140 while leadframe 230B is bonded to chip 111. Bonding to chip 111 may be concurrent with bonding to die-attach lead 230A.

Figure 1B:
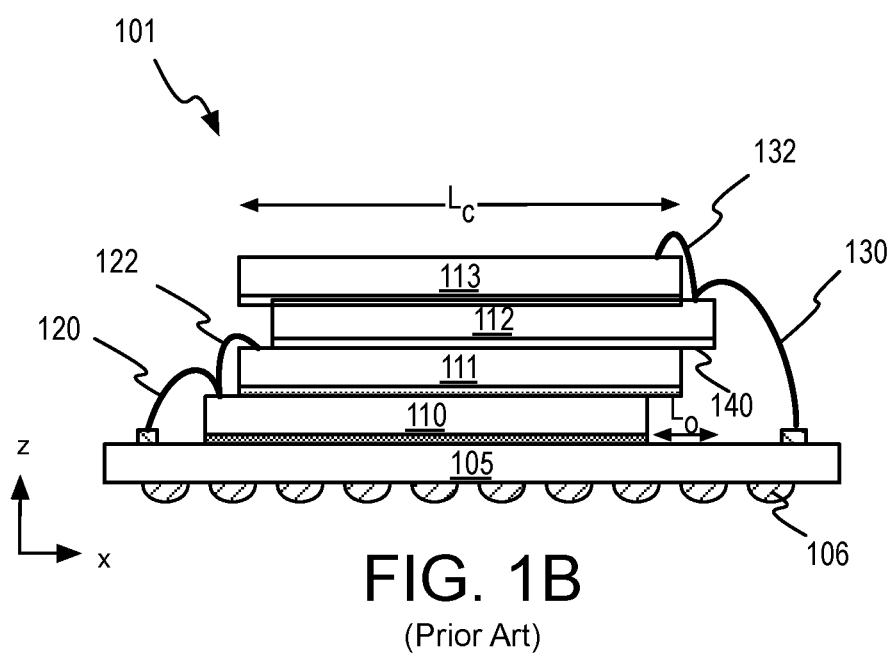
FIG. 1B illustrates a cross-sectional view of a conventional stacked-chip assembly.

In some embodiments, stacked leads are bonded together forming a vertical stack of leads with the bond point in substantial alignment at a periphery of the chip stack edge. As shown in FIG. 2B, lead stack 235N includes a bond point within region 250 where die-attach leads 230D, 230C, 230B and 230A are all bonded together at the same lateral position (e.g., on x-axis) and die-attach lead 230A is further bonded to base lead 220. The footprint of assembly 201 is then a function of chip length $L_c$ and bond length $L_b$. Lateral overlap of the chips ($L_o$ in FIG. 1B) may be eliminated because a chip is stacked over lead portions 270 that are bonded to a metal feature (e.g., bond pad) of a chip. Such a structure is indicative of lead portion 270 being bonded to a first chip before a second chip is stacked on the first chip. As further shown, deformation of each of the die-attach leads in stack 235N may vary, for example with lower leads (e.g., 230A) having a larger bond footprint than upper leads (e.g., 230D). In some embodiments where leads are wedge-bonded, a wedge-bond employed for a lower leads (e.g., 230A) is of a larger diameter than that employed for an upper lead (e.g., 230D). Wedge bond diameter may be selected for each lead level of the stack to ensure a larger bond footprint of lead 230A is sufficient accommodate a smaller bond footprint of lead 230B, which is in-turn sufficient to accommodate a next smaller bond footprint of lead 230C, etc. Depending on the bond footprint of the first die-attach lead and the thickness of the die-attach leads, with each die-attach lead in a stack the bonded surface area between two stacked leads may become progressively more vertically-oriented (e.g., along the z-axis). Depending on the number of leads in a stack, the footprint of the first die-attach lead, and the thickness of the die-attach leads, one or more voids may be present between leads within the bond footprint where a wedge bond does not bottom out. For example, as shown in FIG. 2B, there is a void between leads 230C and 230D within region 250. Electrical contact is nevertheless provided through bonded surfaces of leads 230C and 230D where they are deformed into vertical runs along the z-axis.

Figure 3:
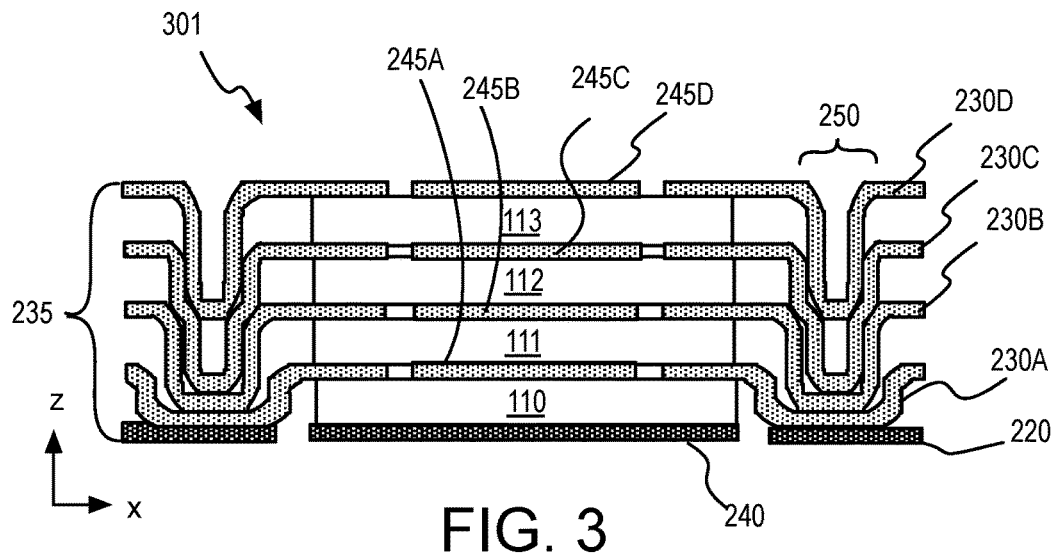
FIGS. 3, 4, 5, and 6 illustrate cross-sectional views of stacked chip assemblies with stack leads, in accordance with alternate embodiments.

In some embodiments, there is no DAP/DAF material between an IC chips and a lead and/or a chip paddle, in which case lead bonds are relied upon to retain the chips during the assembly process. In the absence of DAP/DAF material, an IC chip within the stack may be in direct contact with both a first leadframe paddle on a first surface (e.g., top-side) and a second leadframe paddle on a second surface (e.g., bottom-side). The absence of DAP/DAF material may advantageously reduce z-height of a stacked-chip assembly. The absence of DAP/DAF material may also advantageously increase thermal conduction between chip paddles and adjacent chips under forced air-flow environments (e.g., a ventilated package). In FIG. 3 for example, stacked-chip assembly 301 lacks DAP/DAF material between IC chips 110-113 and die-attach leads 230A-230D. IC chips 111-113 are therefore only anchored by leads 230-233 and/or paddles 245A-245D. In some such embodiments, chips are first mounted to a single leadframe and then the mounted chips are aligned when separate leadframes are stacked together. For example, in FIG. 3, IC chips 110-113 may all be bonded to die-attach leadframes 230A-230D. A first leadframe-mounted chip (e.g., 110) is then aligned with and bonded to a base leadframe including base paddle 240 and base lead 220. A second leadframe-mounted chip (e.g., 111) including die-attach paddle 245B and die-attach lead 230B is then aligned with, and bonded, to the die-attach leadframe including die-attach paddle 245A and die-attach lead 230A. A third leadframe-mounted chip (e.g., 112) including die-attach paddle 245C and die-attach lead 230C is then aligned with, and bonded to, the die-attach leadframe including die-attach paddle 245B and die-attach lead 230B. A fourth leadframe-mounted chip (e.g., 113) including die-attach paddle 245D and die-attach lead 230D is then aligned with, and bonded to, the die-attach leadframe including die-attach paddle 245C and die-attach lead 230C.

Figure 4:
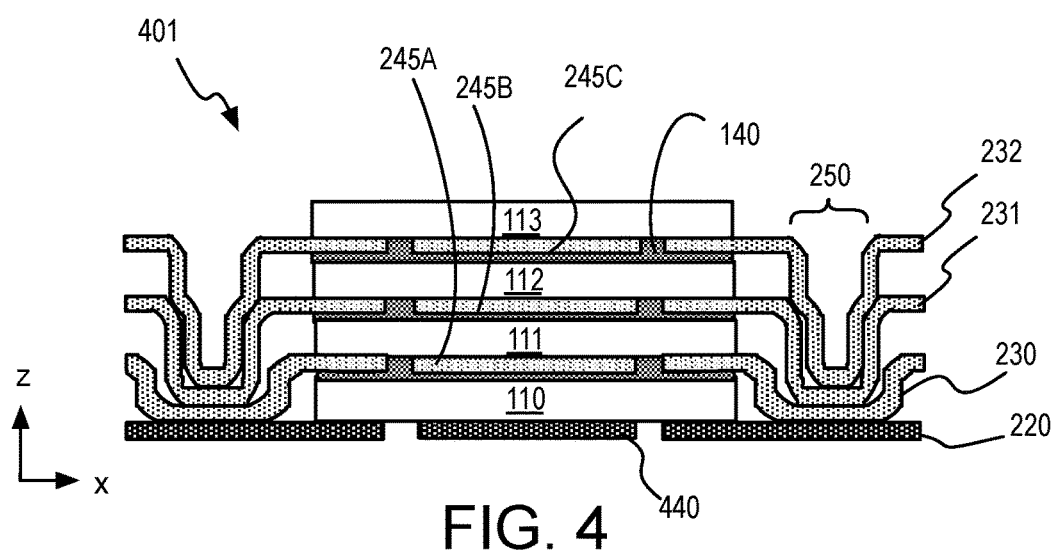
Figure 5:
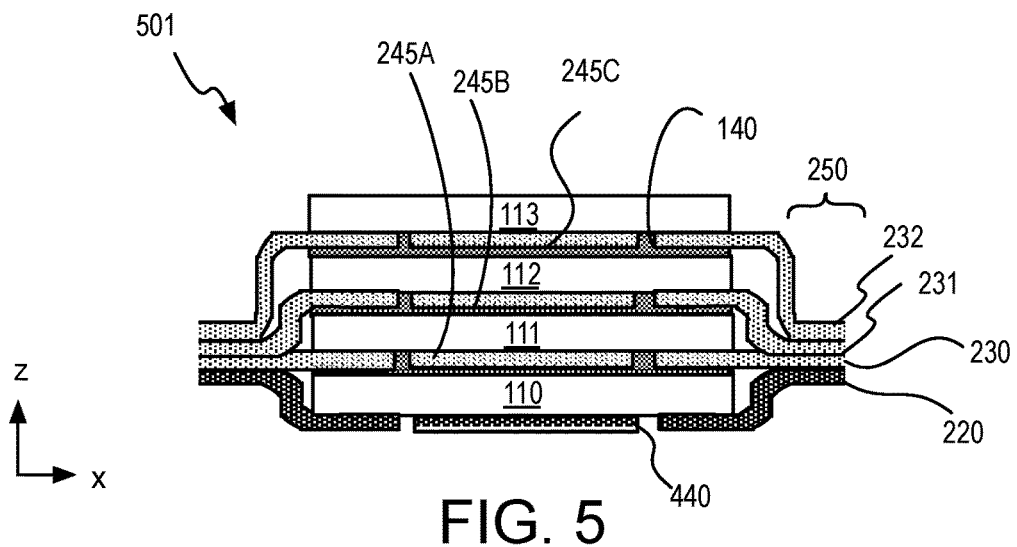

In some embodiments, a stacked-chip assembly includes a stack of chips that are "flipped" onto leads. In the context of a chip stack with leadframes, "flipping" is a reference to the orientation of IC chip relative to a base leadframe. Once chips are mounted onto individual leadframes they may then be stacked with the chips in any orientation (chip up or leadframe up) and the peripheral leadframe portions bonded together. FIG. 4 illustrates a stacked lead assembly 401 in which each of chips 110-113 make electrical connections to leads and/or chip paddles of an underlying leadframe. As shown, a base leadframe includes a base paddle 440 that has substantially the same footprint as die-attach paddles 245A-245C. Base lead 220 makes electrical contact with metal features (e.g., bond pads) on the face of IC chip 110 that faces the base leadframe. Base lead 220 therefore serves as more than a substrate for assembly 401. Die-attach leads 230 are then disposed over IC chip 110, but do not make electrical contact to any metal features on IC chip 110. Instead, die-attach leads 230 make electrical contact to metal features on IC chip 111. Die-attach chip paddle 245A may make electrical contact to IC chip 110, for example to couple chip 110 to a ground plane of the assembly 401. Die-attach chip paddle 245A may also make electrical contact to IC chip 111, for example to couple chip 111 to a ground plane of the assembly 401. In the illustrated embodiment, chips of assembly 401 are separated by DAF/DAP material 140, which may be employed to maintain positioning of the IC chips 110-113 until lead portions 250 are bonded together. Bonding of lead portions 250 may again be incremental, performed with each successive leadframe layer. Alternatively, the bonding of all stacked leads may be a single event performed after the stack has been built up. Orientation of the IC chips relative to the leadframes may become obscured where the bonding process induces lead deformation in the base and die-attach leads symmetrically within the z-axis. For example, FIG. 5 illustrates a stacked-chip assembly 501 where base lead 520 is deformed during lead bonding in a manner similar to die-attach lead 231. For embodiments where a base leadframe has the same thickness and composition as a die-attach leadframe, the base leadframe may be indistinguishable in form and function from the die-attach leadframes, rendering assembly 501 nearly symmetrical in the z-dimension.

Figure 6:
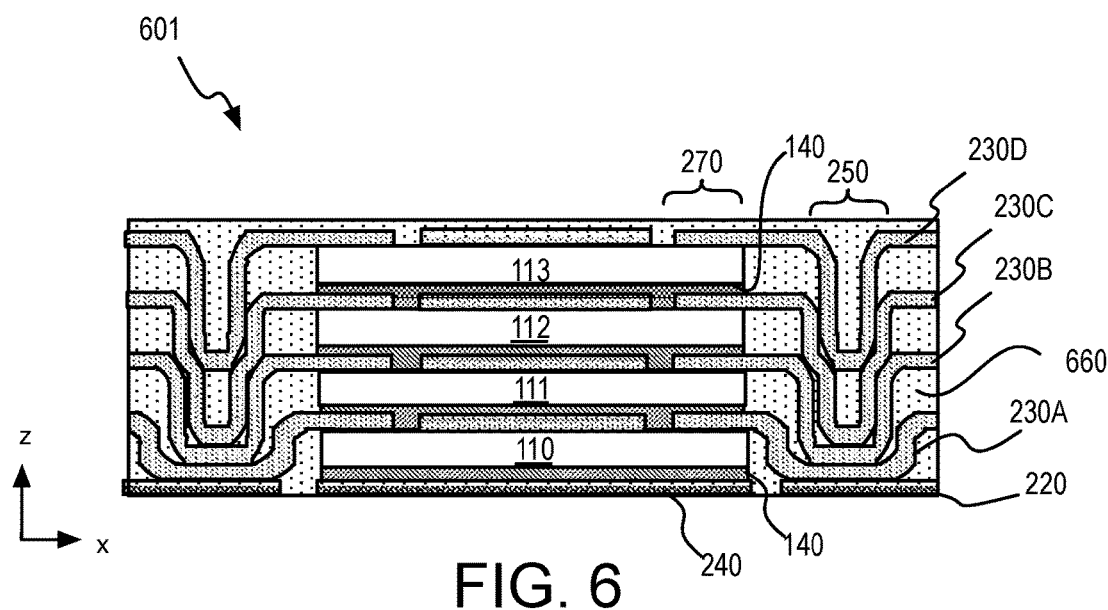

In some embodiments, a mold compound is disposed between unbounded portions of a lead stack. The mold compound may be an epoxy with a filler, such as $SiO_2$. However, other mold compounds known to be suitable for IC chip packaging may be employed. FIG. 6 illustrates an exemplary assembly 601 in which mold compound 660 is disposed between leads 220, 230A, 230B, 230C and 230D. Mold compound 660 may also fill recesses resulted from lead deformation within bonded lead portions 250. Mold compound 660 may all fill in regions between stacked chips. For example, mold compound 660 may backfill a recess between individual bonded lead portions 270, particularly if DAF/DAP material 140 is absent.

Figure 7A:
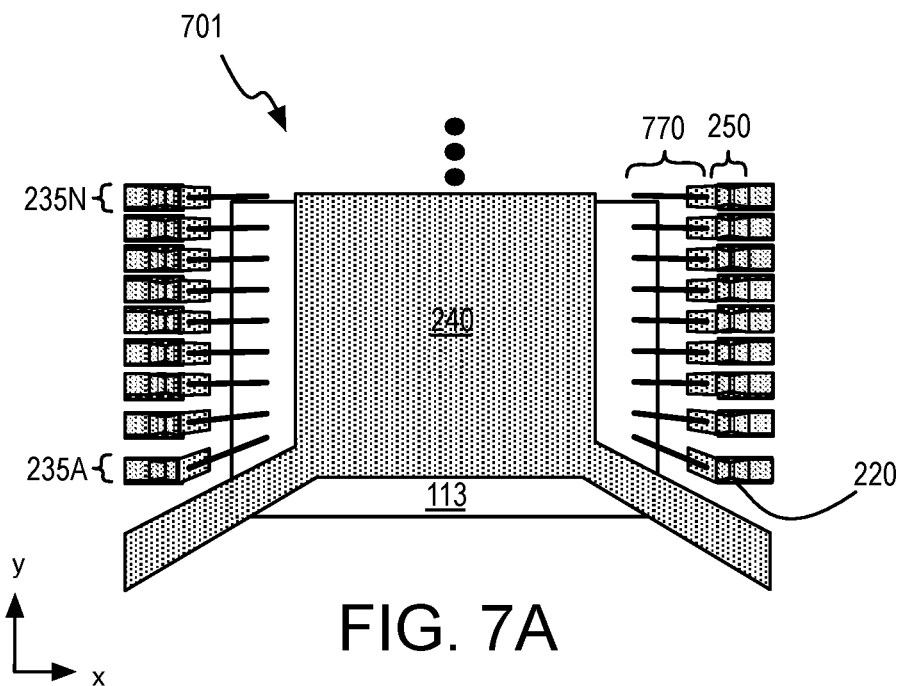
FIG. 7A illustrates a top-down plan view of a stacked-chip assembly including a stacked leads, in accordance with an alternate embodiment.
Figure 7B:
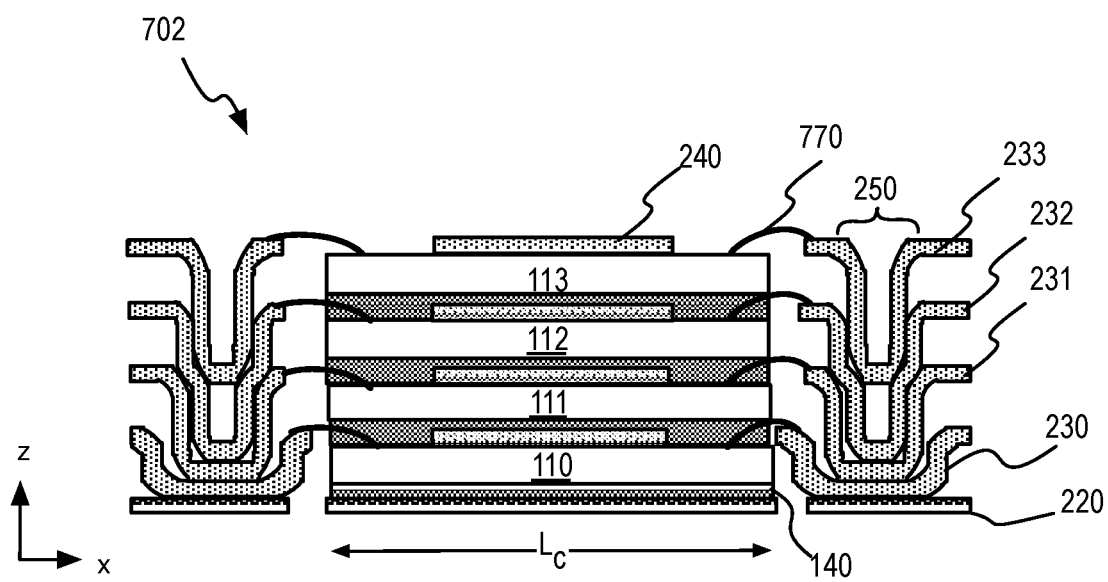
FIG. 7B illustrates a cross-sectional view of a stacked-chip assembly including stacked leads, in accordance with an alternate embodiment.

While all the embodiments described above advantageously lack bond wires, it is noted that leadframe stacking in accordance with some embodiments does not preclude the use of bond wires. A leadframe wire bonded to an IC chip may still be stacked upon another leadframe and bonded together at a periphery of the IC chip. Such embodiments may still gain an advantage of reduced footprint relative to a waterfalled bond wire attachment. FIG. 7A illustrates a top-down plan view of a stacked-chip assembly 701 including a stacked leadframe, in accordance with one such alternate embodiment. FIG. 7B illustrates a cross-sectional view of stacked-chip assembly 701, in accordance with one such alternate embodiment. As shown, lead stacks 235A-235N are electrically connected to IC chips by wires 770 which are bonded to stacked leads that are then bonded together within lead portions 250, substantially as described above in the context of FIG. 2A-FIG. 6. Such an assembly is indicative of a leadframe stacking process that occurs after wire bonding a single IC chip to a single leadframe. Bonding of the leadframes may occur after all leadframes are stacked up or incrementally following the addition of each leadframe to the stack.

Figure 8A:
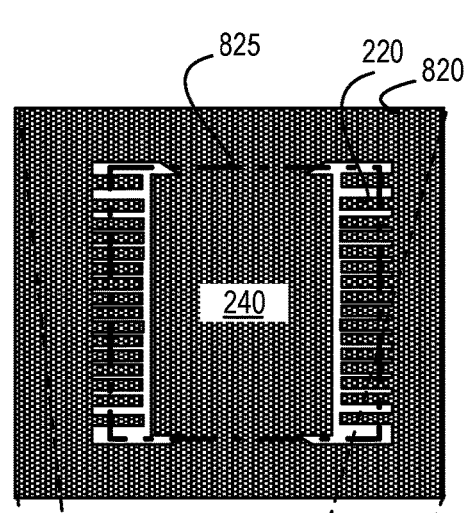
FIG. 8A illustrates a plan view of a base leadframe, in accordance with some embodiments.
Figure 8B:
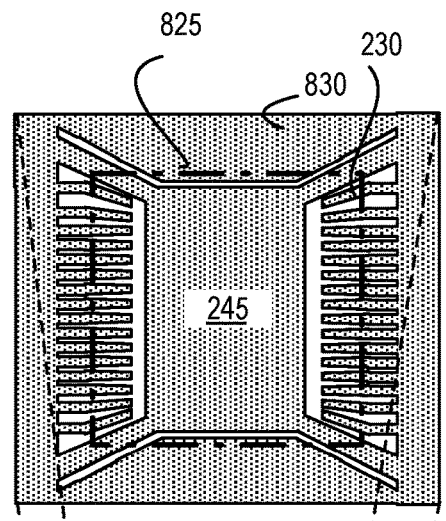
FIG. 8B illustrates a plan view of a die-attach leadframe, in accordance with some embodiments.
Figure 8C:
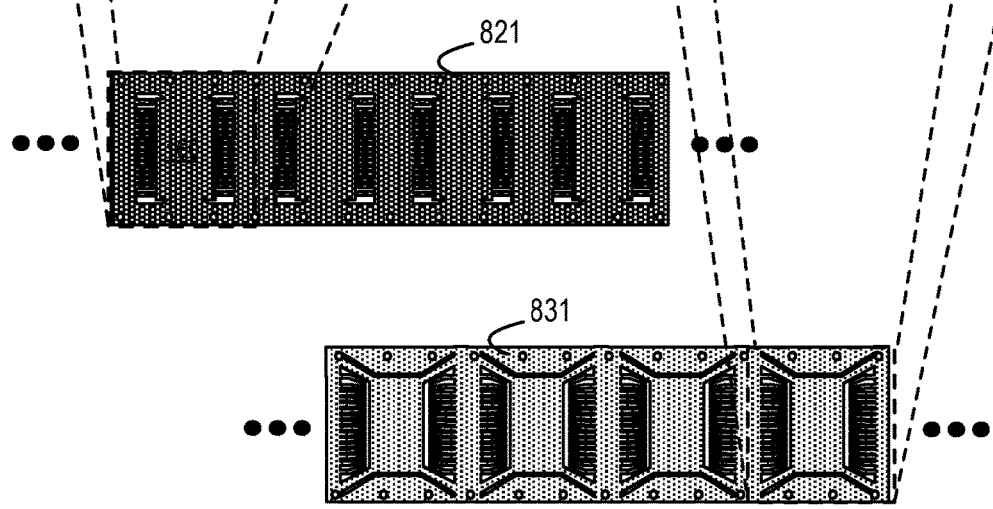
FIG. 8C illustrate leadframe sheets, which may be employed in reel-to-reel packaging technology, in accordance with some embodiments.

In accordance with some embodiments a stacked-chip assembly including stack leads employs only one or two leadframe layouts. Reducing unique leadframe layouts advantageously reduces materials costs and increases manufacturing efficiency. FIG. 8A-8C illustrate an embodiment where all die-attach leadframes have the same footprint, which is distinct from the base leadframe. FIG. 8A illustrates a plan view of base leadframe 820, in accordance with some embodiments. Base leadframe 820 may be stamped out (e.g., after lead bonding) along dashed line 825 to provide chip paddle 240 and base leads 220. FIG. 8B illustrates a plan view of die-attach leadframe 830, in accordance with some embodiments. Die-attach leadframe 830 may be stamped out (e.g., after lead bonding) along dashed line 825 to provide chip paddle 245 and base leads 230. With a plurality of die-attach leadframes 830 stacked over one base leadframe 820, corresponding die-attach leads (e.g., 230A-230D in FIG. 2A-FIG. 6) may therefore all overlay one another as well as base leads 220. The leads may then be bonded together, for example with wedge bonding, and then stamped out of their surrounding foil frames (e.g., along dashed line 825). Independent leads that are not to be stacked and bonded together may be provisioned, for example by wire-bonding only a subset of the leads in the leadframe, or by stamping of the leadframe to selectively bifurcate a subset of the leads in the leadframe.

FIG. 8C illustrate leadframe sheets 820 and 830, which may be employed in reel-to-reel packaging technology, in accordance with some embodiments. Base leadframe sheet 820 may include sprocket holes to be run through a reel-to-reel chip attachment process. Die-attach leadframe sheet 830 may likewise include sprocket holes to be run through a reel-to-reel chip attachment process. Multiple reels of leadframe sheets 830 may be fed into a bonding/stamping apparatus where two or more leadframe sheets 830 are overlaid. Stacked leadframe portions along a periphery of the mounted chips are then pressed, deforming them as need to make contact to each other. The press may concurrently heat the stacked leadframe portions, bonding them together. The press may further cut the bonded lead portions from the surrounding foil to separate the chip assembly from the respective reels. Any number of reels may be superimposed and joined. Leadframe sheet lamination may be performed in an iterative, pairwise manner where the reel-to-reel process may take an input of two reels (e.g., two die-attach sheets 831 or one die-attach sheet 831 and one base sheet 820) and output a single bonded sheet. That bonded sheet may then be fed into another 2:1 reel-to-reel process where the bonded sheet is then laminated to another sheet. At any point, when enough leadframe sheets have been bonded, the assembly may be punched free from the laminate leadframe sheet, for example along the dashed line 825. In alternative embodiments, leadframe sheet lamination is performed with three or more input reels where two or more die-attach sheets 831 and one base sheet 820 are input and all sheets are concurrently bonded together and the resulting stacked-chip assembly punched out of the leadframe laminate. A pre-press may be further employed to deform and/or cut various leads and lead portions before or after a chip is mounted to the leadframe sheet.

Figure 9A:
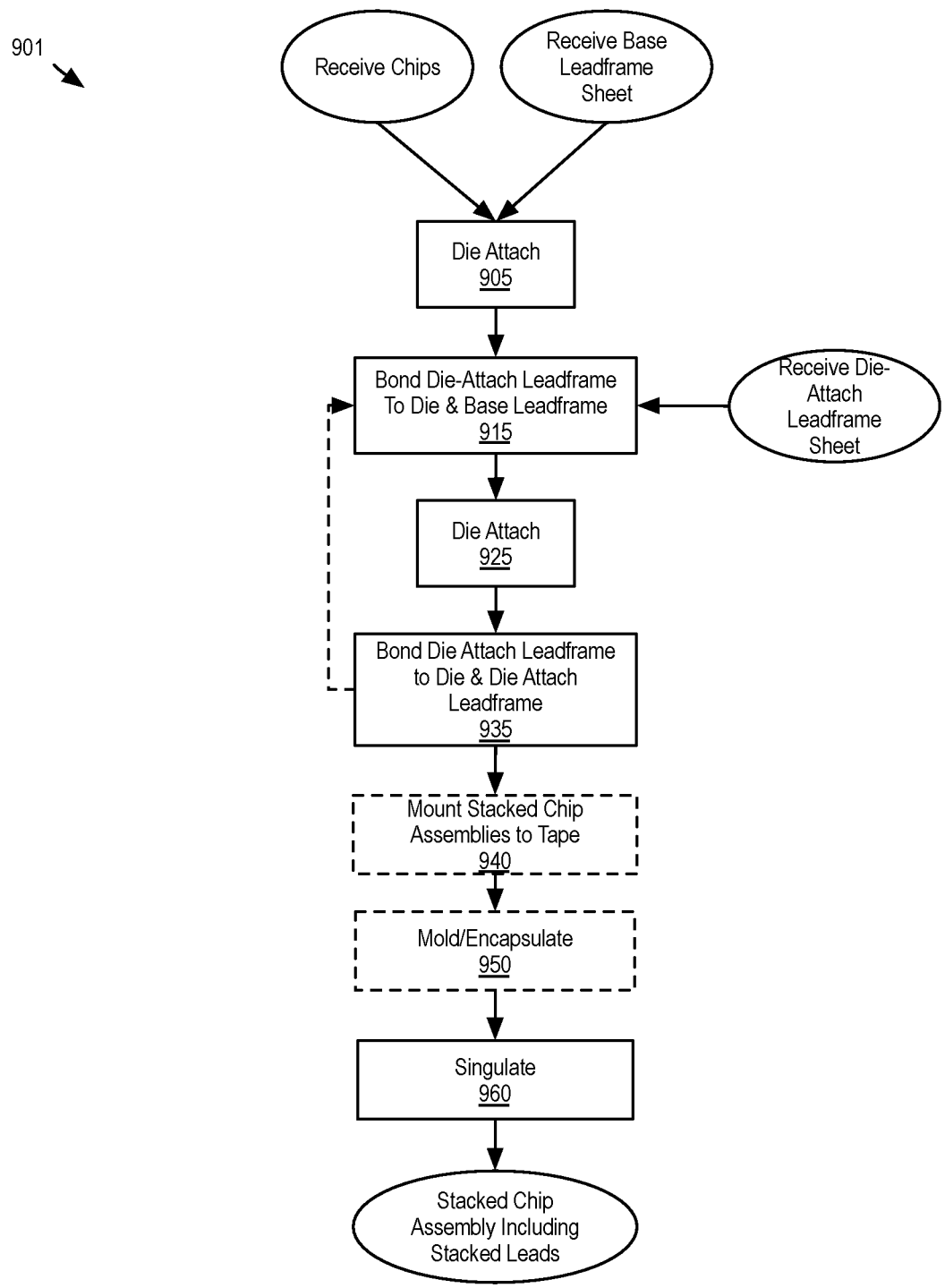
FIG. 9A illustrates a flow diagram of a method for assembling a chip assembly including stacked leads, in accordance with some embodiments.
Figure 9B:
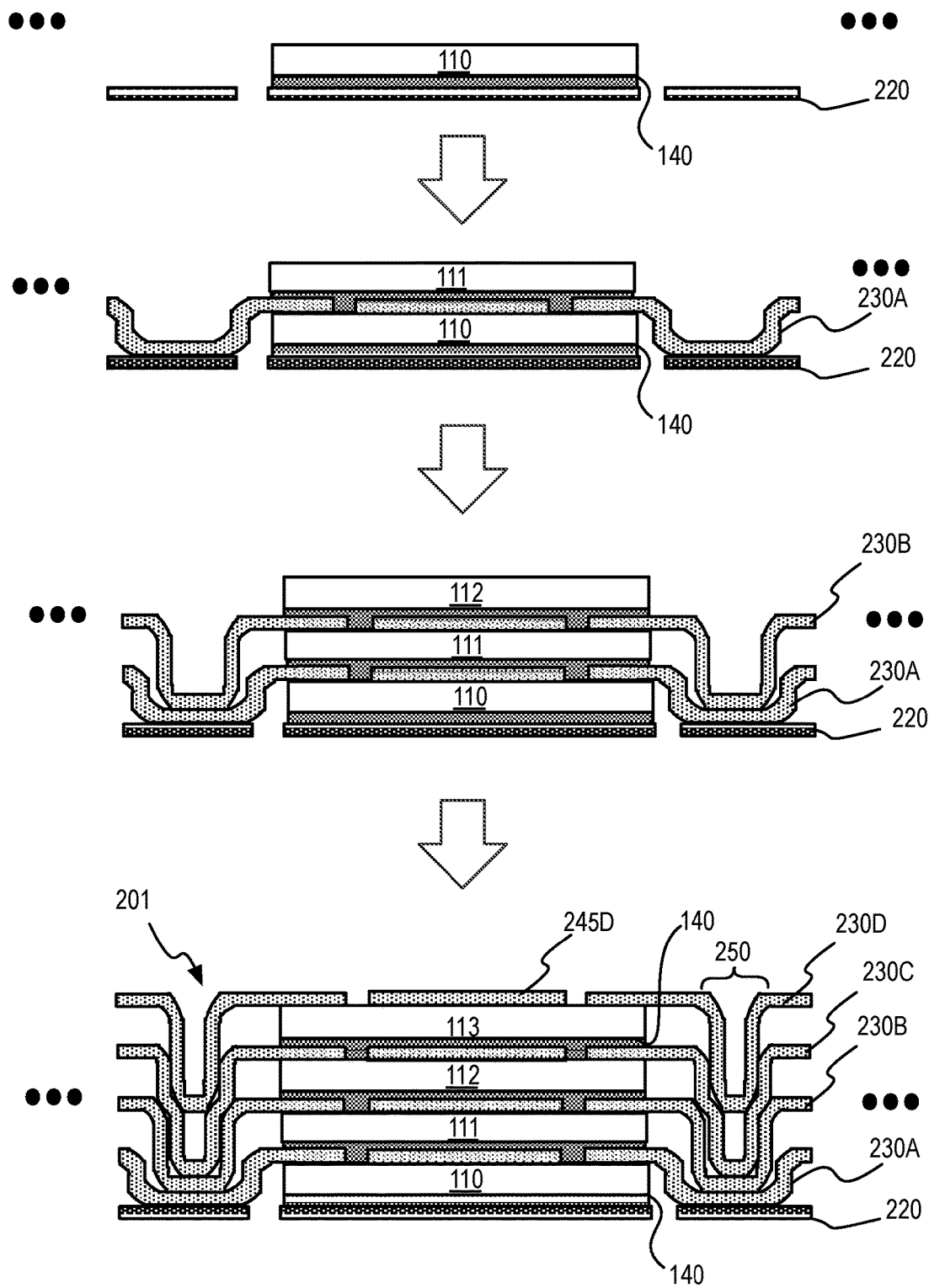
FIG. 9B illustrates cross-sectional views of a stacked-chip assembly as selected operations in the assembly method shown in FIG. 9A is performed, in accordance with some embodiments.

FIG. 9A, 9B illustrate flow diagrams of methods 901, 902 for assembling a stacked-chip assembly including stacked leads, in accordance with some exemplary embodiments. Methods 901, 902 may, for example, be employed to assemble one or more of the assemblies described above.

Referring first to FIG. 9A, method 901 begins with receiving IC chips, such as, but not limited, to memory chips (e.g., flash memory chips, such as NAND). A base leadframe sheet is also received as an input to method 901. At operation 905, a first IC chip is attached to the base leadframe sheet using any technique known to be suitable for the metal features of the IC chip and the base leadframe. For example, the IC chip 110 is aligned and affixed to a chip paddle portion of the base leadframe sheet, as further shown in FIG. 9B, which illustrates cross-sectional views of a stacked-chip assembly as selected operations in the assembly method 901 is performed, in accordance with some embodiments. A pre-press may have been employed upstream of operation 905 to deform and/or cut various leads and lead portions before the IC chip is mounted to the leadframe sheet.

Continuing with FIG. 9A, operation 915 receives a die-attach leadframe sheet as a further input. A pre-press may have been employed upstream of operation 915 to deform and/or cut various leads and lead portions. At operation 915, the die-attach leadframe is bonded to the first IC chip. For example, a paddle portion of the die-attach leadframe may be bonded to a center portion of the first IC chip and first ends of lead portions of the die-attach leadframe may be bonded to separate metal features of the first IC chip. The paddle and lead portions may all be bonded concurrently in a thermal-compression bonder, for example. Method 925 continues where a second IC chip is attached to the die-attach leadframe, for example with a DAF/DAP material. At this point, as further shown in FIG. 9B, the stacked-chip assembly includes two IC chips and two leadframes bonded together.

Returning to FIG. 9A, a second die attach leadframe is bonded to the second IC chip at operation 935. For example, a paddle portion of the die-attach leadframe may be bonded to a center portion of the second IC chip and first ends of lead portions of the die-attach leadframe may be bonded to separate metal features of the second IC chip. The paddle and lead portions may all be bonded concurrently in a thermal-compression bonder, for example. Method 901 may iterated through operations 915, 925 and 935, as denoted by the dashed arrow in FIG. 9A, to build up a stacked-chip assembly that includes any desired number of IC chips and leadframes (e.g., to arrive at assembly 201, as further illustrated in FIG. 9B).

Method 901 (FIG. 9A) then continues through an optional molding operation where a mold compound is flowed between unbounded portions of the leadframe stack. Mold compound may be applied while the stacked leadframes are still in sheet form, or after the assemblies are separated from the leadframe sheets. Separated assemblies may be mounted to a front or back-side tape at operation 940 to facilitate molding/encapsulation of the stack chip assembly at operation 950. Where the assemblies are molded while still mounted to leadframe sheets, taping operation 940 may be skipped. At operation 960, the assemblies, molded or not, are singulated, for example using any technique known. The output of method 901 is then a stacked-chip assembly including stack leads, for example as described elsewhere herein.

Figure 9C:
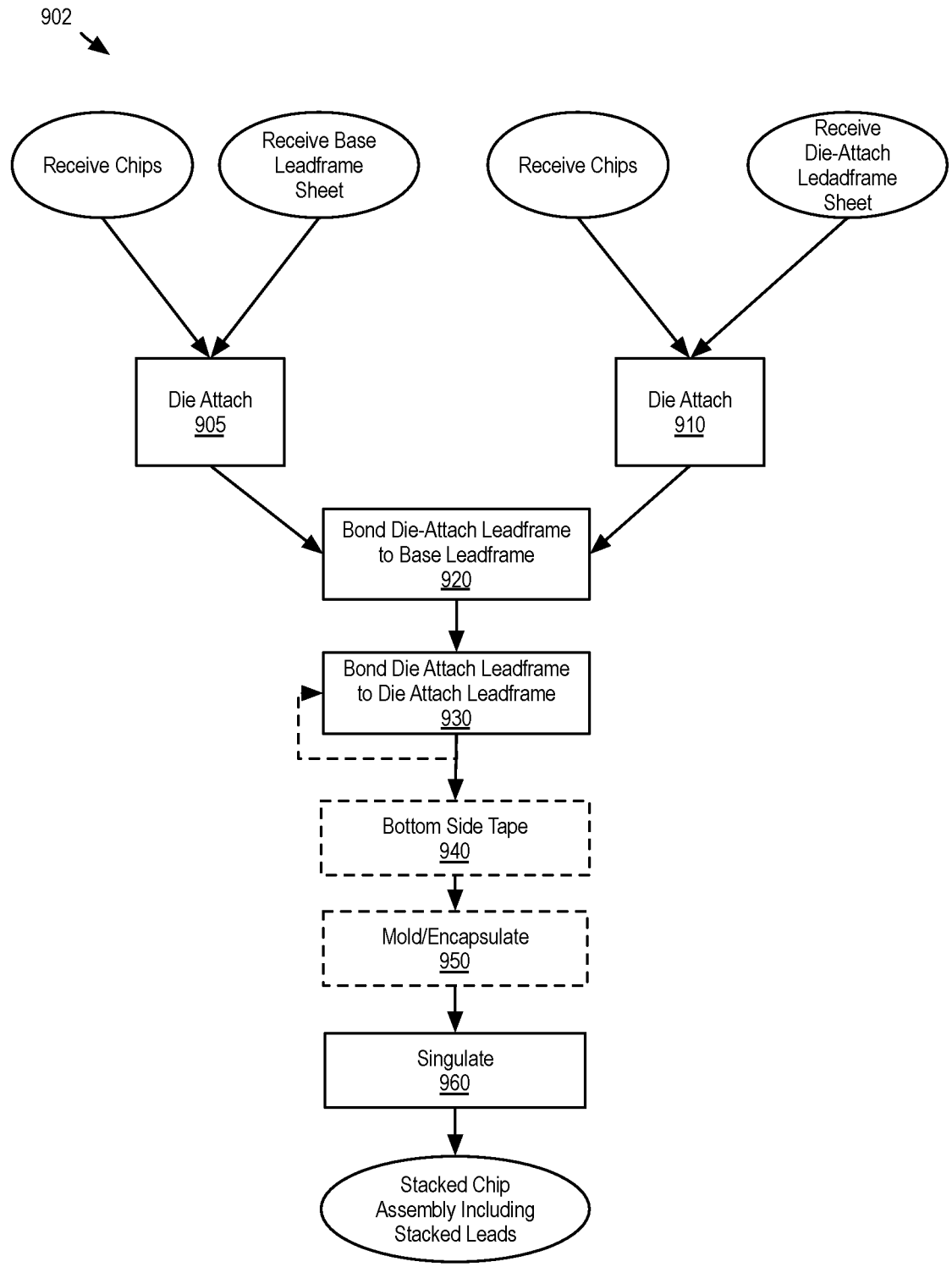
FIG. 9C illustrates a flow diagram of an alternate method for assembling a chip assembly including stacked leads, in accordance with some embodiments.

Referring to FIG. 9C, method 902 exemplifies some alternate embodiments where IC chips are first mounted to individual leadframes and then the chip-mounted leadframes stacked and bonded. Die attach operation 905 receives first IC chips, such as but not limited to, memory chips (e.g., flash memory chips, such as NAND), and receives a base leadframe sheet. A pre-press may have been employed upstream of operation 905 to deform and/or cut various leads and lead portions. In some embodiments, the IC chips are epoxied or otherwise adhered to the base leadframe sheet. In some other embodiments, the IC chips are bonded to the base leadframe sheet with the each of the bonds making an electrical connections to one of the IC chips. Die attach operation 910 receives second IC chips, such as, but not limited to memory chips (e.g., flash memory chips, such as NAND), and receives a die-attach leadframe sheet. The second IC chips are bonded to the die-attach leadframe sheet with each of the bonds making an electrical connection to one of the IC chips. A pre-press may have been employed upstream of operation 910 to deform and/or cut various leads and lead portions. For embodiments where the base leadframe and die-attach leadframe are the same, operations 905 and 910 may be merged into a single die-attach operation that is repeated to generate a plurality of chip-mounted leadframe sheets. At operation 920, leadframe sheets are aligned one over the other and bonded, for example with a thermal compression wedge bonder, to join spatially co-located leads forming a lead stack. At operation 930, a second die-attach leadframe having another mounted IC chip is aligned over the stack-up and bonded to the first die-attach leadframe to increase the stacked chip count. Alternatively, operations 920 and 930 may be performed concurrently with more than two unbounded leadframe sheets being aligned relative to each other and bonded together with one thermo-compression bonding process. Operation 930 may be repeated as desired to increase the IC chip count. Method 901 then continues through an optional molding operation where a mold compound is flowed between unbounded portions of the leadframe stack. Mold compound may be applied while the stacked leadframes are still in sheet form, or after the assemblies are separated from the leadframe sheets. Separated assemblies may be mounted to a front or back-side tape at operation 940 to facilitate molding/encapsulation of the stack chip assembly at operation 950. Where the assemblies are molded while still mounted to leadframe sheets, taping operation 940 may be skipped. At operation 960, the assemblies, molded or not, are singulated, for example using any technique known. The output of method 901 is then a stack chip assembly including stack leads, for example as described elsewhere herein.

Figure 10:
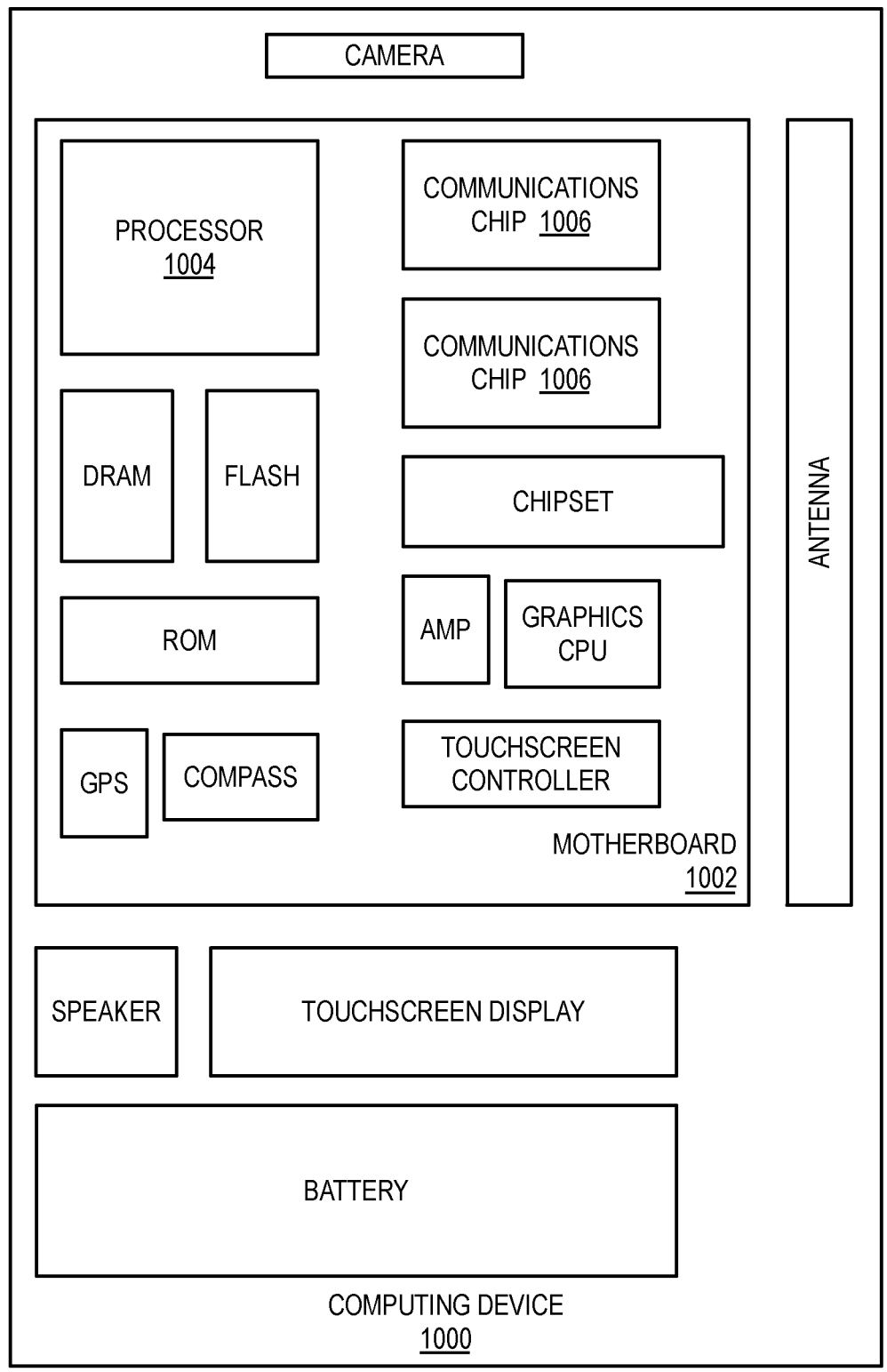
FIG. 10 is a functional block diagram of an electronic computing device, in accordance with some embodiments.

FIG. 10 is a functional block diagram of an electronic computing device, in accordance with an embodiment of the present invention. Device 1000 further includes a motherboard 1002 hosting a number of components, such as, but not limited to, a processor 1004 (e.g., an applications processor). Processor 1004 may be physically and/or electrically coupled to motherboard 1002. In some examples, processor 1004 includes an integrated circuit die packaged within the processor 1004. In general, the term "processor" or "microprocessor" may refer to any device or portion of a device that processes electronic data from registers and/or memory to transform that electronic data into other electronic data that may be further stored in registers and/or memory.

In various examples, one or more communication chips 1006 may also be physically and/or electrically coupled to the motherboard 1002. In further implementations, communication chips 1006 may be part of processor 1004. Depending on its applications, computing device 1000 may include other components that may or may not be physically and electrically coupled to motherboard 1002. These other components include, but are not limited to, volatile memory (e.g., DRAM), non-volatile memory (e.g., ROM), flash memory (e.g., NAND or NOR), a graphics processor, a digital signal processor, a crypto processor, a chipset, an antenna, touchscreen display, touchscreen controller, battery, audio codec, video codec, power amplifier, global positioning system (GPS) device, compass, accelerometer, gyroscope, speaker, camera, and mass storage device (such as hard disk drive, solid-state drive (SSD), compact disk (CD), digital versatile disk (DVD), and so forth), or the like. In some exemplary embodiments, at least the flash memory comprises a stacked-chip assembly including stacked leads, for example as described elsewhere herein.

Communication chips 1006 may enable wireless communications for the transfer of data to and from the computing device 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chips 1006 may implement any of a number of wireless standards or protocols, including but not limited to those described elsewhere herein. As discussed, computing device 1000 may include a plurality of communication chips 1006. For example, a first communication chip may be dedicated to shorter-range wireless communications, such as Wi-Fi and Bluetooth, and a second communication chip may be dedicated to longer-range wireless communications such as GPS, EDGE, GPRS, CDMA, WiMAX, LTE, Ev-DO, and others.

Figure 11:
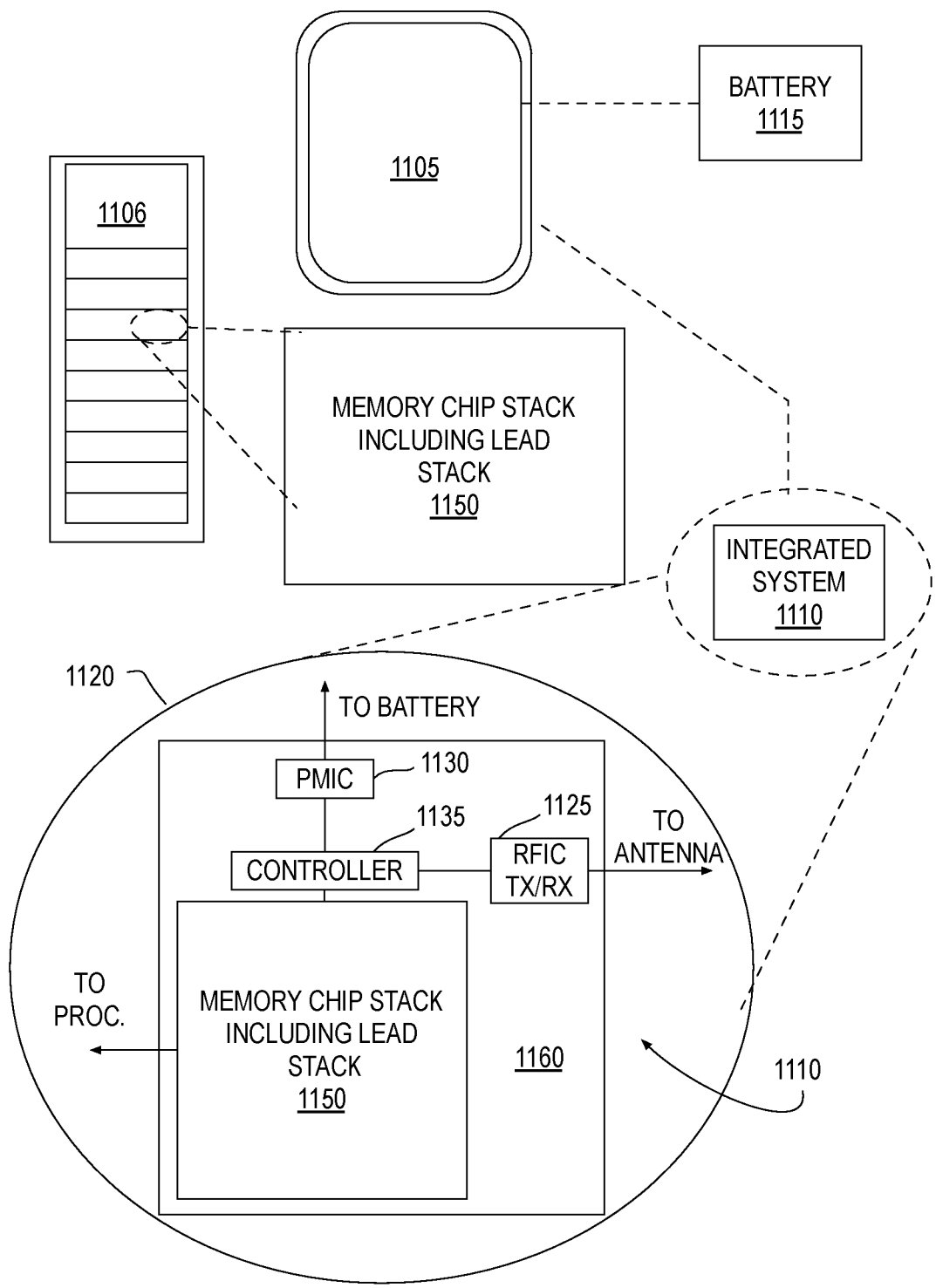
FIG. 11 illustrates a mobile computing platform and a data server machine employing a memory chip stack include stacked leads, in accordance with some embodiments.

FIG. 11 illustrates a mobile computing platform and a data server machine employing a stacked memory chip assembly including stack leads, for example as described elsewhere herein. Computing device 1000 may be found inside platform 1105 or server machine 1106, for example. The server machine 1106 may be any commercial server, for example including any number of high-performance computing platforms disposed within a rack and networked together for electronic data processing, which in the exemplary embodiment includes a packaged monolithic SoC 1150. The mobile computing platform 1105 may be any portable device configured for each of electronic data display, electronic data processing, wireless electronic data transmission, or the like. For example, the mobile computing platform 1105 may be any of a tablet, a smart phone, laptop computer, etc., and may include a display screen (e.g., a capacitive, inductive, resistive, or optical touchscreen), a chip-level or package-level integrated system 1110, and a battery 1115.

Whether disposed within the integrated system 1110 illustrated in the expanded view 1120, or as a stand-alone chip within the server machine 1106, stacked memory chip assembly 1150 includes a plurality of memory chips and a plurality of stacked leads, for example as described elsewhere herein. Memory chip stack 1150 may be further coupled to a board, a substrate, or an interposer 1160 along with, one or more of a power management integrated circuit (PMIC) 1130, RF (wireless) integrated circuit (RFIC) 1125 including a wideband RF (wireless) transmitter and/or receiver (TX/RX) (e.g., including a digital baseband and an analog front end module further comprises a power amplifier on a transmit path and a low noise amplifier on a receive path), and a controller 1135.

Functionally, PMIC 1130 may perform battery power regulation, DC-to-DC conversion, etc., and so has an input coupled to battery 1115 and with an output providing a current supply to other functional modules. As further illustrated, in the exemplary embodiment, RFIC 1125 has an output coupled to an antenna (not shown) to implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 4G, and beyond.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

In one or more first embodiments, an integrated circuit (IC) chip assembly comprises an IC chip stack including at least a first and second IC chip, and a lead stack including at least a first and second lead, the first lead electrically coupled to at least the first IC chip and bonded to the second lead at a periphery of the chip stack, the second lead electrically coupled to at least the second IC chip.

In one or more second embodiments, for the IC chip assembly in any of the first embodiments, the first lead includes a first portion bonded to a first metal feature of the first chip, the second lead includes a first portion bonded to the first metal feature of the second chip, and the first and leads include second portions that are bonded together.

In one or more third embodiments, for the IC chip assembly in any of the first or second embodiments, the lead stack includes a base lead and a die-attach lead disposed over the base lead, the first chip is disposed between the base lead and the die-attach lead, the second chip is disposed over the die-attach lead, and a first die-attach lead is bonded to a first base lead at the periphery of the chip stack.

In one or more fourth embodiments, for the IC chip assembly in any of the third embodiments, the first die-attach lead is bonded to a metal feature of the first or second chip.

In one or more fifth embodiments, for the IC chip assembly in any of the third embodiments, the die-attach lead further comprises a first die-attach lead and a second die-attach lead, the first chip is disposed between the base lead and the first die-attach lead, the second chip is disposed between the first and second die-attach leads, a portion of the first die-attach lead is bonded to the base lead, and a portion the second die-attach lead is bonded to the bonded portion of the first die-attach lead.

In one or more sixth embodiments, for the IC chip assembly in any of the fifth embodiments, a portion of the first die-attach lead is bonded to a metal feature of the first chip, and a portion of the second die-attach lead is bonded to a metal feature of the second chip.

In one or more seventh embodiments, the IC chip assembly in any of the first, second, third, fourth, fifth, or sixth embodiments further includes a metal paddle disposed between the first and second IC chips, the paddle electrically isolated from at least one of the leads.

In one or more eighth embodiments, the IC chip assembly in any of the first, second, third, fourth, fifth, sixth seventh embodiments further includes a metal paddle disposed between first and second IC chips, the paddle electrically coupling each of the chips to a common reference voltage rail.

In one or more ninth embodiments, the IC chip assembly in any of the first, second, third, fourth, fifth, sixth seventh, or eighth embodiments further comprises a die-attach paste or film disposed between at least one of the leads and the first or second IC chip.

In one or more tenth embodiments, the IC chip assembly in any of the first, second, third, fourth, fifth, sixth seventh, eighth, or ninth embodiments further comprises a mold compound disposed between unbonded portions of the first and second leads.

In one or more eleventh embodiments, an integrated circuit (IC) platform comprises a substrate including a plurality of signal pads, and the IC chip assembly in any of the first, second, third, fourth, fifth, sixth, seventh, eighth, ninth, or tenth embodiments, wherein the first lead is electrically coupled to one of the signal pads.

In one or more twelfth embodiments, for the IC platform in the eleventh embodiments, the substrate further includes a ground pad, and the IC chip assembly further includes a metal paddle disposed between the first IC chip and the substrate, the metal paddle electrically isolated from the first lead and electrically coupled to the ground pad.

In one or more thirteenth embodiments, for the IC platform in the twelfth embodiments, the IC chips comprise a plurality of NAND flash memory chips.

In one or more fourteenth embodiments, a method of assembling an integrated circuit (IC) chip stack comprises stacking a first and second leadframe, and bonding first leads of the first leadframe to corresponding second leads of the second leadframe that are stacked over the first leads, the bonded first leads further coupled to a first IC chip and the bonded second leads further coupled to a second IC chip stacked over the first.

In one or more fifteenth embodiments, the method in any of the fourteenth embodiments further comprises attaching the first leadframe to the first IC chip, attaching the second leadframe to the second IC chip, and singulating the chip stack from the stacked leadframes at a location beyond the lead-to-lead bonds to maintain electrical continuity between the stacked leads.

In one or more sixteenth embodiments, the method in any of the fourteenth or fifteenth embodiments further comprises stacking the second chip over the first chip prior to attaching the second leadframe to the second IC chip.

In one or more seventeenth embodiments, the method in any of the fourteenth or fifteenth embodiments further comprises attaching the second leadframe to the second IC chip prior to stacking the second chip over the first chip.

In one or more eighteenth embodiments, in the method of the fourteenth or fifteenth embodiments, attaching the first leadframe to the first chip further comprises bonding the first leads to metal features on a front-side surface of the first chip, attaching the second leadframe further comprises bonding the second leads to metal features on a front-side surface of the second chip, and bonding the first leads to the second leads further comprises wedge-bonding the second leads to the first leads at a location beyond an edge of the first and second chips.

In one or more nineteenth embodiments, the method of the eighteenth embodiments further comprises adhering a back-side surface of the first IC chip a paddle of a base leadframe, and bonding the first leads to corresponding leads of the base leadframe prior to bonding the second leads to the first leads.

In one or more twentieth embodiments, the method of the eighteenth embodiments further comprises adhering a back-side surface the second chip to the first leadframe before bonding the second leadframe to the second chip.

It will be recognized that the invention is not limited to the embodiments so described, but can be practiced with modification and alteration without departing from the scope of the appended claims. For example the above embodiments may include specific combinations of features as further provided below.

What is claimed is:

1. An integrated circuit (IC) chip assembly, comprising:
   an IC chip stack including at least a first IC chip and a second IC chip;
   a lead stack including at least a first lead and a second lead, the first lead electrically coupled to at least the first IC chip and bonded to the second lead at a periphery of the chip stack, the second lead electrically coupled to at least the second IC chip; and
   a mold compound disposed between unbonded portions of the first and second leads.

2. The IC chip assembly of claim 1, wherein:
   the first lead includes a first portion bonded to a first metal feature of the first chip;
   the second lead includes a first portion bonded to the first metal feature of the second chip; and
   the first and second leads include second portions that are bonded together.

3. The IC chip assembly of claim 1, wherein:
   the lead stack includes a base lead and a die-attach lead disposed over the base lead;
   the first chip is disposed between the base lead and the die-attach lead;
   the second chip is disposed over the die-attach lead; and
   a first die-attach lead is bonded to a first base lead at the periphery of the chip stack.

4. The IC chip assembly of claim 3, wherein the first die-attach lead is bonded to a metal feature of the first or second chip.

5. The IC chip assembly of claim 3, wherein:
   the die-attach lead further comprises a first die-attach lead and a second die-attach lead;
   the first chip is disposed between the base lead and the first die-attach lead;
   the second chip is disposed between the first and second die-attach leads;
   a portion of the first die-attach lead is bonded to the base lead; and
   a portion the second die-attach lead is bonded to the bonded portion of the first die-attach lead.

6. The IC chip assembly of claim 5, wherein
   a portion of the first die-attach lead is bonded to a metal feature of the first chip; and
   a portion of the second die-attach lead is bonded to a metal feature of the second chip.

7. The IC chip assembly of claim 1, further including a metal paddle disposed between the first and second IC chips, the paddle electrically isolated from at least one of the leads.

8. The IC chip assembly of claim 1, further including a metal paddle disposed between first and second IC chips, the paddle electrically coupling each of the chips to a common reference voltage rail.

9. The IC chip assembly of claim 1, further comprising a die-attach paste or film disposed between at least one of the leads and the first or second IC chip.

10. An integrated circuit (IC) platform, comprising:
    a substrate including a plurality of signal pads; and
    the IC chip assembly of claim 1, wherein the first lead is electrically coupled to one of the signal pads.

11. The IC platform of claim 10, wherein:
    the substrate further includes a ground pad; and
    the IC chip assembly further includes a metal paddle disposed between the first IC chip and the substrate, the metal paddle electrically isolated from the first lead and electrically coupled to the ground pad.

12. The IC platform of claim 11, wherein the IC chips comprise a plurality of NAND flash memory chips.

13. A method of assembling an integrated circuit (IC) chip stack, the method comprising:
    attaching a first leadframe to a first IC chip;
    attaching a second leadframe to a second IC chip;
    stacking the first and second leadframes;
    bonding first leads of the first leadframe to corresponding second leads of the second leadframe that are stacked over the first leads, the bonded first leads further coupled to the first IC chip, and the bonded second leads further coupled to the second IC chip stacked over the first IC chip; and
    singulating the chip stack from the stacked leadframes at a location beyond a lead-to-lead bond to maintain electrical continuity between the first and second leads.

14. The method of claim 13, further comprising stacking the second chip over the first chip prior to attaching the second leadframe to the second IC chip.

15. The method of claim 13, further comprising attaching the second leadframe to the second IC chip prior to stacking the second chip over the first chip.

16. The method of claim 13, wherein:
    attaching the first leadframe to the first chip further comprises bonding the first leads to metal features on a front-side surface of the first chip;
    attaching the second leadframe further comprises bonding the second leads to metal features on a front-side surface of the second chip; and
    bonding the first leads to the second leads further comprises wedge-bonding the second leads to the first leads at a location beyond an edge of the first and second chips.

17. The method of claim 16, further comprising:
    adhering a back-side surface of the first IC chip to a paddle of a base leadframe; and
    bonding the first leads to corresponding leads of the base leadframe prior to bonding the second leads to the first leads.

18. The method of claim 16, further comprising adhering a back-side surface the second chip to the first leadframe before bonding the second leadframe to the second chip.

19. An integrated circuit (IC) chip assembly, comprising:
    an IC chip stack comprising at least a first IC chip and a second IC chip;
    a lead stack comprising at least a first lead and a second lead, the first lead electrically coupled to at least the first IC chip and bonded to the second lead at a periphery of the chip stack, the second lead electrically coupled to at least the second IC chip; and
    a die-attach paste or film disposed between at least one of the leads and the first or second IC chip.

20. An integrated circuit (IC) chip assembly, comprising:
    an IC chip stack comprising at least a first IC chip and a second IC chip;
    a lead stack comprising at least a first lead and a second lead, the first lead electrically coupled to at least the first IC chip and bonded to the second lead at a periphery of the chip stack, the second lead electrically coupled to at least the second IC chip; and a metal paddle disposed between the first and second IC chips, the paddle electrically isolated from at least one of the leads.

* * * * *